(12) United States Patent
Fan et al.

(10) Patent No.: US 12,217,667 B2
(45) Date of Patent: Feb. 4, 2025

(54) DISPLAY PANEL, BRIGHTNESS COMPENSATION METHOD AND DISPLAYING DEVICE

(71) Applicant: BOE Technology Group Co., Ltd., Beijing (CN)

(72) Inventors: Xing Fan, Beijing (CN); Chao Kong, Beijing (CN); Xiangmin Wen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 589 days.

(21) Appl. No.: 17/509,822

(22) Filed: Oct. 25, 2021

(65) Prior Publication Data
US 2022/0293050 A1 Sep. 15, 2022

(30) Foreign Application Priority Data
Mar. 9, 2021 (CN) .......................... 202110257448.1

(51) Int. Cl.
 *G09G 3/3225* (2016.01)
 *H10K 50/856* (2023.01)
 (Continued)

(52) U.S. Cl.
 CPC ......... *G09G 3/3225* (2013.01); *H10K 50/856* (2023.02); *H10K 59/122* (2023.02);
 (Continued)

(58) Field of Classification Search
 CPC ............... G09G 3/3225; G09G 3/3258; G09G 2320/0233; G09G 2320/029;
 (Continued)

(56) References Cited

U.S. PATENT DOCUMENTS

2010/0245216 A1* 9/2010 Nakamura ............. H10K 59/13
 345/76
2016/0254336 A1 9/2016 Zhang et al.
 (Continued)

FOREIGN PATENT DOCUMENTS

CN 104155791 A 11/2014
CN 105807513 A 7/2016
 (Continued)

OTHER PUBLICATIONS

CN202110257448.1 first office action.

*Primary Examiner* — Mohammad A Rahman
*Assistant Examiner* — Sandra Milena Rodriguez Villan
(74) *Attorney, Agent, or Firm* — IPro, PLLC

(57) ABSTRACT

The disclosure provides a display panel, a compensation of brightness method and a displaying device. The display panel comprises an array substrate, a luminescent layer, a plurality of optical film layers and a photoelectric sensor, wherein the luminescent layer is located on one side of the array substrate, the array substrate is used for driving the luminescent layer to emit light, the optical film layers are located on a side, away from the array substrate, of the luminescent layer, light emitted by the luminescent layer forms optical waveguide on the array substrate and/or the optical film layers, and the photoelectric sensor is used for acquiring the optical waveguide to perform compensation of brightness on the light emitted by the luminescent layer according to data of the optical waveguide.

16 Claims, 5 Drawing Sheets

(51) Int. Cl.
*H10K 59/122* (2023.01)
*H10K 102/00* (2023.01)

(52) U.S. Cl.
CPC . *G09G 2320/0233* (2013.01); *G09G 2360/16* (2013.01); *H10K 2102/00* (2023.02)

(58) Field of Classification Search
CPC ......... G09G 2360/16; G09G 2360/145; H10K 50/856; H10K 59/122; H10K 59/13; H10K 59/878; H10K 59/60; H10K 2102/00; G02F 1/1523; G02F 1/15245; G02F 1/153; G02F 1/163
See application file for complete search history.

(56) References Cited

U.S. PATENT DOCUMENTS

| | | |
|---|---|---|
| 2018/0149941 A1 | 5/2018 | Gu et al. |
| 2019/0051236 A1 | 2/2019 | Deng et al. |
| 2019/0066555 A1 | 2/2019 | Gu et al. |
| 2019/0067394 A1 * | 2/2019 | Cheon .................. G09G 3/3225 |
| 2019/0386033 A1 | 12/2019 | Li et al. |
| 2020/0328260 A1 | 10/2020 | Tang |
| 2021/0020869 A1 | 1/2021 | Xie et al. |
| 2021/0327976 A1 | 10/2021 | Yang et al. |
| 2022/0005882 A1 | 1/2022 | Li et al. |
| 2022/0037432 A1 | 2/2022 | Xu et al. |

FOREIGN PATENT DOCUMENTS

| | | |
|---|---|---|
| CN | 106125442 A | 11/2016 |
| CN | 107274834 A | 10/2017 |
| CN | 108598121 A | 9/2018 |
| CN | 109427300 A | 3/2019 |
| CN | 105511195 B | 5/2019 |
| CN | 109950295 A | 6/2019 |
| CN | 110164384 A | 8/2019 |
| CN | 110197839 A | 9/2019 |
| CN | 110212004 A | 9/2019 |
| CN | 110689588 A | 1/2020 |
| CN | 111370458 A | 7/2020 |
| CN | 111489658 A | 8/2020 |
| CN | 111583861 A | 8/2020 |

* cited by examiner

DISPLAY PANEL, BRIGHTNESS COMPENSATION METHOD AND DISPLAYING DEVICE

CROSS REFERENCE TO RELEVANT APPLICATIONS

The present application claims the priority of the Chinese patent application filed on Mar. 9, 2021 before the Chinese Patent Office with the application number of 202110257448.1 and the title of "DISPLAY PANEL, BRIGHTNESS COMPENSATION METHOD AND DISPLAYING DEVICE", which is incorporated herein in its entirety by reference.

TECHNICAL FIELD

The disclosure relates to the field of display, in particular to a display panel, a brightness compensation method and a displaying device.

BACKGROUND

An organic light-emitting diode (OLED) display is a self-luminous displaying device that displays images by emitting light through an OLED. Compared with a liquid crystal display (LCD), the OLED display is thinner and lighter, and has better display properties. As the next generation displaying device for portable electronic devices, the OLED display has attracted much attention.

Generally, an active driving mode of an OLED component adopts voltage driving. Voltage-driven compensation may be achieved by electrical compensation or optical compensation. The optical compensation directly takes brightness as a compensation object, and after compensation, the advantages such as high uniformity of brightness may be realized, so the optical compensation is highly recognized and even called the ultimate compensation method.

SUMMARY

The disclosure provides a display panel, a brightness compensation method and a displaying device.

The display panel provided by the embodiments of the disclosure comprises:
  an array substrate;
  a luminescent layer located on one side of the array substrate, the array substrate being used for driving the luminescent layer to emit light;
  a plurality of optical film layers located on a side, away from the array substrate, of the luminescent layer, light emitted by the luminescent layer forming optical waveguide on the array substrate and/or the optical film layers; and
  a photoelectric sensor used for acquiring the optical waveguide to perform brightness compensation on the light emitted by the luminescent layer according to the data of the optical waveguide.

The brightness compensation method provided by the embodiments of the disclosure is applied to the display panel according to any one of the above embodiments, and the compensation method comprises:
  acquiring optical waveguide data of the photoelectric sensor;
  calculating a brightness difference according to the optical waveguide data; and
  adjusting a driving voltage output by a driving chip according to the brightness difference to perform brightness compensation on light emitted by the corresponding luminescent layer.

The displaying device provided by the embodiments of the disclosure comprises the display panel according to any one of the above embodiments.

Additional aspects and advantages of the disclosure will be set forth in part in the following description, and in part will be obvious from the following description, or may be learned by practice of the disclosure.

BRIEF DESCRIPTION OF THE DRAWINGS

The above and/or additional aspects and advantages of the disclosure will become apparent and easily understood from the description of embodiments taken in conjunction with the following drawings, in which.

DETAILED DESCRIPTION

Figure 1:
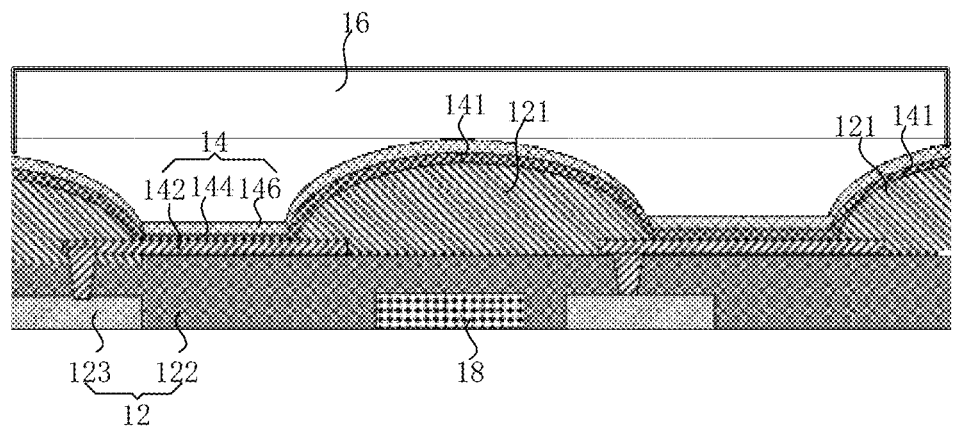
FIGS. 1-7 are structural diagrams of a display panel according to an embodiment of the disclosure.

The embodiments of the disclosure are described in detail below, and the examples of the embodiments are shown in the accompanying drawings, in which identical or similar reference numerals denote identical or similar elements or elements having identical or similar functions throughout. The embodiments described below with reference to the drawings are exemplary, are only used to explain the disclosure, and should not be construed limiting the disclosure.

In the description of the disclosure, it should be understood that directional or positional relationships indicated by the terms such as "center", "longitudinal", "transverse", "length", "width", "thickness", "upper", "lower", "front", "rear", "left", "right", "vertical", "horizontal", "top", "bottom", "inner", "outer", "clockwise" and "counterclockwise" are based on the directional or positional relationships shown in the drawings, which are only for facilitating and simplifying the description of the disclosure, but do not indicate or imply that the devices or elements referred to must have a specific orientation or be constructed and operated in a specific orientation, so they cannot be understood as limiting the disclosure. In addition, the terms "first" and "second" are only used for the descriptive purpose, and cannot be understood as indicating or implying relative importance or implicitly indicating the number of indicated technical features. Therefore, the features defined with "first" and "second" may be explicitly or implicitly include one or more of the features. In the description of the disclosure, "a plurality of" means two or more, unless otherwise specifically defined.

In the description of the disclosure, it should be noted that, unless otherwise specified and limited, the terms "install" and "connect" should be understood in a broad sense, for example, they may be fixed connection, detachable connection, integrated connection, mechanical connection, electrical connection, mutual communication, direct connection, indirect connection through an intermediate medium, internal communication between two elements or interaction between two elements. For those of ordinary skill in the art, the specific meanings of the above terms in the disclosure may be understood according to specific situations.

The following provides many different embodiments or examples for implementing different structures of the disclosure. In order to simplify the disclosure, components and arrangements of specific examples are described below. Of course, they are only examples and are not intended to limit the disclosure. In addition, the disclosure may repeat reference numerals and/or reference letters in different examples, and such repetition is for the sake of simplicity and clarity, and does not itself indicate the relationship between the various embodiments and/or arrangements discussed. In addition, the disclosure provides examples of various specific processes and materials, but those of ordinary skill in the art may realize the application of other processes and/or the use of other materials.

An organic light-emitting diode (OLED) display is a self-luminous displaying device that displays images by emitting light through an OLED. Compared with a liquid crystal display (LCD), the OLED display is thinner and lighter, and has better display properties. As the next generation displaying device for portable electronic devices, the OLED display has attracted much attention.

Active driving of OLED components may be achieved through voltage driving, current driving and digital driving. Compared with current driving and digital driving, voltage driving features a simple structure, is more suitable for large-size display, and has a higher driving speed. Therefore, voltage driving has been widely used currently. However, due to the nonuniform display brightness caused by the nonuniformity of a thin film transistor (TFT), power voltage drop and the nonuniformity of an OLED, the brightness of pixels needs to be compensated.

In terms of brightness compensation of voltage driving, the current compensation methods may include electrical compensation and optical compensation according to the compensation object. The electrical compensation may be further divided into internal compensation and external compensation. The internal compensation is mainly for TFT Vth, while the external compensation involves more objects, including TFT Vth, mobility and OLED aging. However, these do not represent all the differences in electrical parameters, let alone differences other than electrical parameters. Therefore, compensation has certain limitations, and brightness uniformity after compensation is not good enough. In addition, the compensation of electrical parameters has a compensation range, and uniformity after compensation with poor uniformity of electrical parameters may still be very poor. However, the optical compensation directly takes brightness as the compensation object, and after compensation, the brightness may be highly uniform, so the optical compensation is highly recognized and even called the ultimate compensation method. However, the current optical compensation technology uses a CCD camera to collect the brightness of each pixel for compensation, which requires relatively large equipment, so it is limited to one-time compensation before products leave the factory, and cannot compensate for the brightness difference caused by aging after long-term use.

In view of this, referring to FIG. 1, an embodiment of the disclosure provides a display panel 10, and the display panel 10 comprises an array substrate 12, a luminescent layer 14, optical film layers 16 and a photoelectric sensor 18.

The luminescent layer 14 is located on one side of the array substrate 12, the array substrate 12 is used for driving the luminescent layer 14 to emit light, the plurality of optical film layers 16 are located on a side, away from the array substrate 12, of the luminescent layer 14, light emitted by the luminescent layer 14 forms optical waveguide on the array substrate 12 and/or the optical film layers 16, and the photoelectric sensor 18 is used for acquiring the optical waveguide to perform brightness compensation on the light emitted by the luminescent layer 14 according to data of the optical waveguide.

In the display panel 10 of the embodiment, the optical waveguide formed by the light emitted from the luminescent layer 14 on the array substrate 12 and/or the optical film layers 16 may be obtained through the arrangement of the photoelectric sensor 18, so that the display panel 10 may calculate a brightness difference of the light emitted from the luminescent layer according to the data of the optical waveguide, and may perform brightness compensation on the light emitted by the luminescent layer 14 according to the brightness difference, thus ensuring the brightness uniformity of the display panel 10 and improving the visual effect of the display panel 10.

It may be understood by those people skilled in the relevant art that the photoelectric sensor 18 is a device that converts optical signals into electrical signals, whose working principle is based on the photoelectric effect. The photoelectric effect means that when light irradiates some substances, electrons of the substances absorb the energy of photons, and then a corresponding electrical effect occurs. According to different phenomena of the photoelectric effect, the photoelectric effect may be divided into three categories: external photoelectric effect, internal photoelectric effect and photovoltaic effect. The photoelectric sensor 18 may comprise, but is not limited to, a phototube, a photomultiplier tube, a photoresistor, a photodiode, a phototransistor, a photocell, etc.

The display panel 10 is an OLED display panel. The display panel 10 may emit light through the luminescent layer 14 and transmit the light out of the display panel 10 through the optical film layers 16, so that users may see images displayed by the display panel 10; or, the display panel 10 may emit light through the luminescent layer 14 and transmit the light out of the display panel 10 through the optical film layers 16 and the array substrate 12. It may be understood that if the light emitted from the luminescent layer 14 is transmitted out of the display panel 10 only through the optical film layers 16, the display panel 10 is a display panel which may realize one-sided display; if the light emitted from the luminescent layer 14 is transmitted out of the display panel 10 through the optical film layers 16 and the array substrate 12, the display panel 10 is a display panel which may implement double-sided display; that is, in this disclosure, the display panel 10 may realize both one-sided display and double-sided display.

Further, the display panel 10 may be either a top emission structure or a bottom emission structure. It may be understood by those people skilled in the relevant art that in the bottom emission structure, the light emitted by the luminescent layer 14 may only be partially emitted from an opening formed in a driving panel (TFT), and most of the light is wasted, so an aperture ratio is low. In the top emission structure, the light emitted from the luminescent layer 14 may be emitted from the top (optical film layers 16) without being affected by TFT, so the aperture ratio is effectively improved.

The array substrate 12 and the optical film layers 16 are both of transparent structures, so that the light emitted from the luminescent layer 14 may pass through the array substrate 12 and the optical film layers 16 and form the optical waveguide on the array substrate 12 or the optical film layers 16.

The luminescent layer 14 comprises a plurality of sub-luminescent layers which are disposed at intervals, each sub-luminescent layer comprises an anode metal layer 142, an electroluminescent layer 144 and a cathode metal layer 146 which are disposed in sequence, and the sub-luminescent layers emit light when a voltage is applied between the electrodes of the anode metal layer 142 and the cathode metal layer 146.

When the display panel 10 is a top emission structure, the anode metal layer 142 may be made of a conductive reflective material, and the cathode metal layer 146 may be made of a conductive transparent material. In some specific examples, the anode metal layer 142 may be made of a magnesium/silver (Mg:Ag) alloy, and the cathode may be made of silver/indium tin oxide (Ag/ITO). In this way, the external quantum effect of a top emission display backplane may be improved by using the above-mentioned material with a good reflection effect as the anode metal layer 142 and the material with high light transmittance as the cathode.

When the display panel 10 is of a bottom emission structure, the cathode metal layer 146 constituting the luminescent layer 14 is made of a conductive opaque material, and the anode metal layer 142 is made of a conductive transparent material.

A plurality of photoelectric sensors 18 may be configured, and each photoelectric sensor 18 may correspond to one sub-luminescent layer or multiple sub-luminescent layers. The photoelectric sensors 18 are used for receiving the optical waveguide in the array substrate 12 or receiving the optical waveguide in the optical film layers 16. The photoelectric sensors 18 may be disposed in either the array substrate 12 or the optical film layers 16, so that the optical waveguide on the array substrate 12 or the optical film layers 16 may be acquired. It may be understood that since the optical waveguide is formed on the array substrate 12 or the optical film layers 16 by the light emitted by the pixels, the brightness of the optical waveguide has a one-to-one correspondence relationship with the brightness of the light emitted by the sub-luminescent layers 14. Therefore, after the photoelectric sensors 18 receive the optical waveguide, the display panel 10 may compensate for the brightness of the light emitted by different sub-luminescent layers 14 according to the brightness of the optical waveguide, thus improving the brightness uniformity of the display panel 10.

Further referring to FIG. 1, in some embodiments, the display panel 10 is of a top emission structure, a first pixel defining layer 121 is located between two adjacent pixels, the photoelectric sensor 18 is disposed corresponding to the first pixel defining layer 121, the luminescent layer 14 comprises a first reflecting layer 141 attached to a surface of the first pixel defining layer 121, and the optical waveguide passes through the first pixel defining layer 121 and is reflected by the first reflecting layer 141 to the photoelectric sensor 18.

The first pixel defining layer 121 may be made of a transparent organic material, such as polymethylmethacrylate (PMMA) and polyurethane (PU), to effectively reduce the absorption of the optical waveguide by the first pixel defining layer 121. The first reflecting layer 141 may be made of the same material as the anode metal layer 142.

Specifically, the array substrate 12 further comprises a planarization layer 122 and a source-drain layer 123, wherein the planarization layer 122 is disposed on a side, away from the luminescent layer 14, of the first pixel defining layer 121 and is located on the same layer as the source-drain layer 123. The planarization layer 122 may be made of a transparent organic material, and the photoelectric sensor 18 is disposed in the planarization layer 122. When the luminescent layer 14 emits light, because the anode metal layer 142 of the pixel is made of a reflective material, the light cannot pass through the anode metal layer 142, and transversely propagates to the first pixel defining layer 121 rather than to form the optical waveguide, while the first pixel defining layer 121 is made of a transparent material, and the optical waveguide passes through the first pixel defining layer 121 and is reflected by the first reflecting layer 141 on the surface of the first pixel defining layer 121 to the photoelectric sensor 18 disposed on the planarization layer 122, so as to be detected by the photoelectric sensor 18.

Certainly, in other embodiments, the photoelectric sensor 18 may also be disposed in other organic layers included in the array substrate 12, such as an active layer, an interlayer dielectric layer (ILD), a grid layer (GE) and other organic layers, as long as the photoelectric sensor 18 may acquire the optical waveguide.

Figure 2:
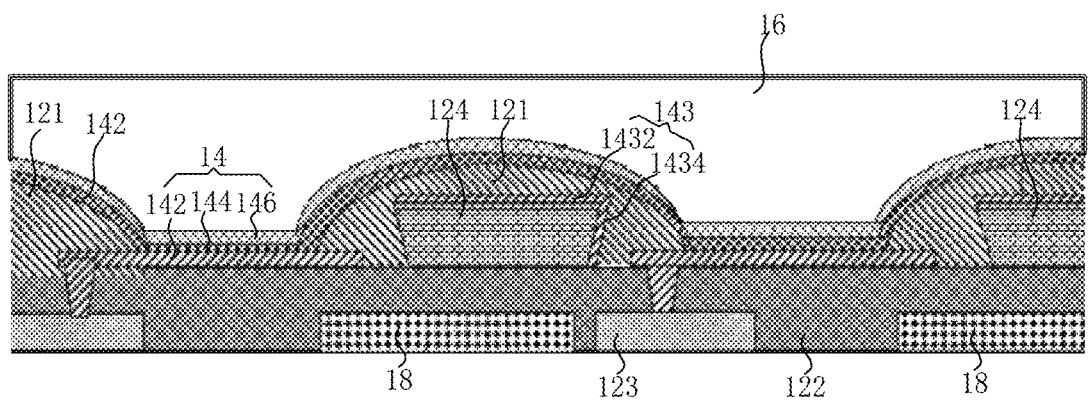

Referring to FIG. 2, in some embodiments, the array substrate 12 further comprises a second pixel defining layer 124, the second pixel defining layer 124 is disposed in the first pixel defining layer 121, the luminescent layer 14 may further comprise a second reflecting layer 143, the second reflecting layer 143 is attached to a surface of the second pixel defining layer 124, and the optical waveguide passes through the second pixel defining layer 124 and is reflected by the second reflecting layer 143 to the photoelectric sensor 18.

It may be understood that in the above embodiment, the optical waveguide is reflected to the photoelectric sensor 18 through the first reflecting layer 141 on the surface of the first pixel defining layer 121, and since the first reflecting layer 141 is disposed on the surface of the first pixel defining layer 121, the propagation path of the optical waveguide is long, which decreases the intensity of the optical waveguide received by the photoelectric sensor 18, resulting in poor accuracy of compensation by the display panel 10 according to the optical waveguide. Therefore, the second pixel defining layer 124 is disposed in the first pixel defining layer 121, and the second reflecting layer 143 made of a reflective material is attached to the surface, so that the optical waveguide meets the second reflecting layer 143 on the surface of the second pixel defining layer 124 and is then reflected by the second reflecting layer 143 to the photoelectric sensor 18. In this way, the propagation path of the optical waveguide is shortened, so that the accuracy of compensation performed by the display panel 10 according to the optical waveguide becomes higher.

With further reference to FIG. 2, in some embodiments, the second pixel defining layer 124 is of an inverted trapezoidal shape, and the second reflecting layer 143 comprises a top surface 1432 and a first oblique surface 1434, wherein the top surface 1432 is disposed on a side, away from the array substrate 12, of the second pixel defining layer 124, the first oblique surface 1434 is attached to an oblique edge of the second pixel defining layer 124 and connected with the top surface 1432, and the optical waveguide passes through the second pixel defining layer 124 and is reflected by the top surface 1432 and the first oblique surface 1434 to the photoelectric sensor 18.

It should be noted that the second pixel defining layer 124 being of an inverted trapezoidal shape means that the shape of the second pixel defining layer 124 is an inverted trapezoid in the cross-sectional direction of the display panel 10 as shown in FIG. 2.

In this way, the optical waveguide may pass through the first pixel defining layer 121 and the second pixel defining layer 124 in sequence and be reflected by the top surface 1432 and the first oblique surface 1434 to the photoelectric sensor 18 in the planarization layer 122, so that more optical waveguide may be obtained by the photoelectric sensor 18, and the brightness compensation accuracy of the display panel 10 is improved.

Figure 3:
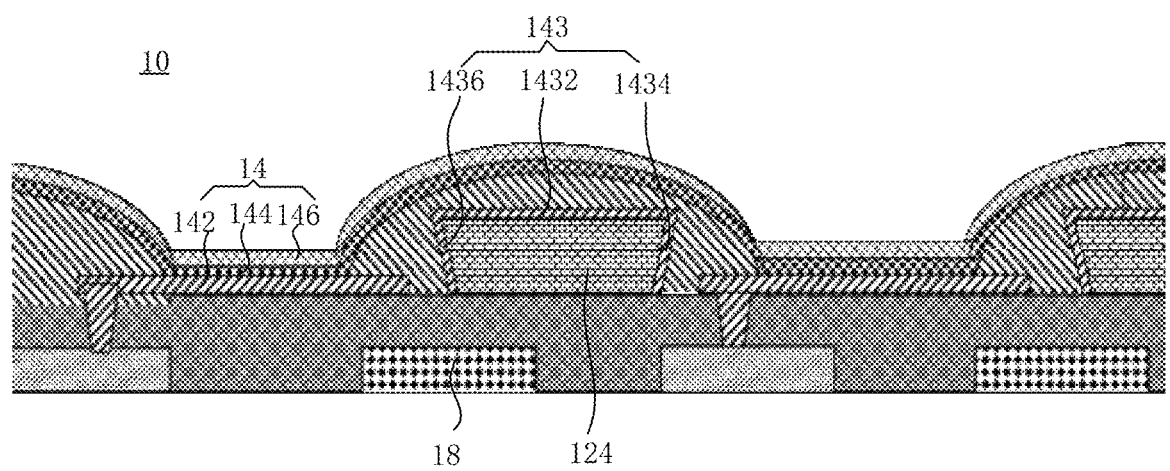

Referring to FIG. 3, in some embodiments, the second pixel defining layer 124 is of an inverted trapezoid shape, and the second reflecting layer 143 comprises a top surface 1432, a first oblique surface 1434 and a second oblique surface 1436; and the first top surface 1432 is disposed on a side, away from the array substrate 12, of the second pixel defining layer 124, the first oblique surface 1434 and the second oblique surface 1436 are symmetrically disposed on two sides of the top surface 1432 and are attached to the second pixel defining layer 124, and the optical waveguide passes through the second pixel defining layer 124 to the second oblique surface 1436 and is reflected by the second oblique surface 1436 to the photoelectric sensor 18.

In this way, the optical waveguide propagates along the first pixel defining layer 121 to the second oblique surface 1436 attached to the second pixel defining layer 124, and then is reflected by the second oblique surface 1436 to the photoelectric sensor 18, which further shortens the propagation path of the optical waveguide to the photoelectric sensor 18, increases the intensity of the optical waveguide, and further improves the brightness compensation accuracy of the display panel 10.

Figure 4:
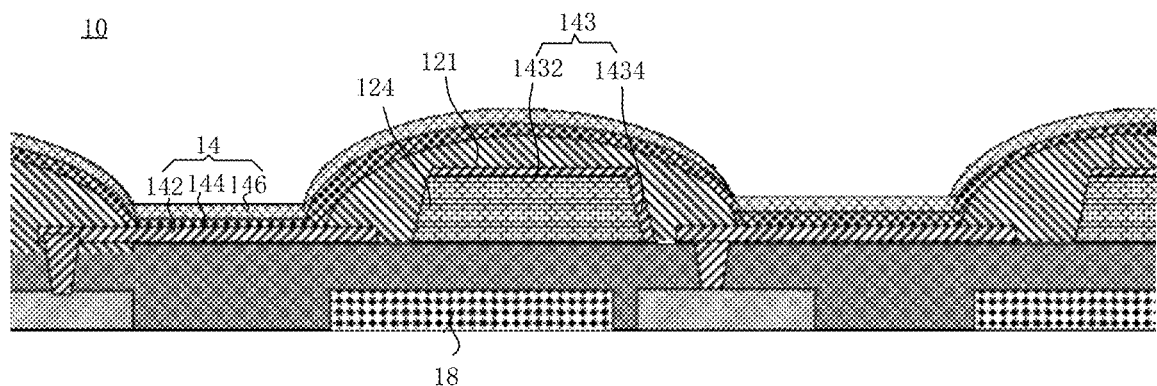

Referring to FIG. 4, in some embodiments, the second pixel defining layer 124 is trapezoidal, and the second reflecting layer 143 comprises a top surface 1432 and a first oblique surface 1434; and the top surface 1432 is attached to a side, away from the array substrate 12, of the second pixel defining layer 124, the first oblique surface 1434 is attached to an oblique surface of the second pixel defining layer 124 and connected with the top surface 1432, and the optical waveguide passes through the second pixel defining layer 124 and is reflected to the photoelectric sensor 18 through the top surface 1432.

It may be understood that, compared with the arrangement in the above embodiment in which the top surface 1432 and the first oblique surface 1434 of the second pixel defining layer 124 which is of an inverted trapezoid shape form an acute angle, after the optical waveguide propagates transversely from the electroluminescent layer 144 to the second pixel defining layer 124 and is reflected by the top surface 1432, part of the optical waveguide is blocked and reflected by the first oblique surface 1434, which extends the path of this part of optical waveguide, in this embodiment, since the second pixel defining layer 124 is trapezoidal and the included angle between the top surface 1432 and the first oblique surface 1434 is obtuse, after the optical waveguide propagates transversely from the electroluminescent layer 144 to the second pixel defining layer 124 and is reflected by the top surface 1432, the first oblique surface 1434 may reduce the blocking of the optical waveguide, so that the optical waveguide may be directly reflected by the top surface 1432 and enter the photoelectric sensor 18, allowing the photoelectric sensor 18 to obtain more optical waveguide.

Figure 5:
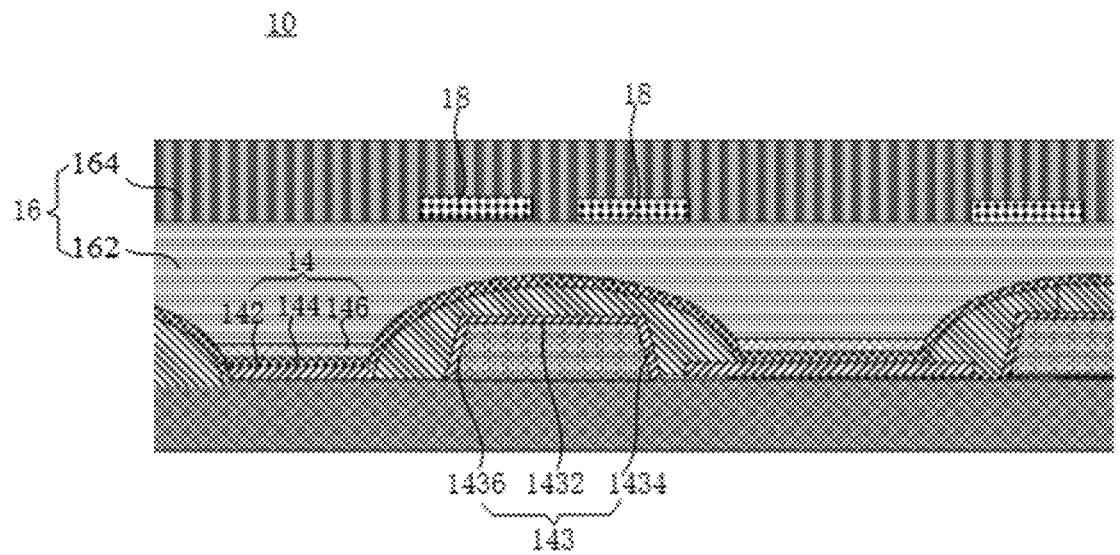

Referring to FIG. 5, in some embodiments, the display panel 10 is of a bottom emission structure, the optical film layer 16 comprises a thin film packaging layer 162 and a light-transmitting module layer 164 disposed in sequence, the light-transmitting module layer 164 is disposed on a side, away from the luminescent layer 14, of the thin film packaging layer 162, and the photoelectric sensor 18 is disposed in the light-transmitting module layer 164 and located in a light-emitting side direction of the second pixel defining layer 124.

It should be noted that, when the display panel 10 is of a bottom emission structure, the first reflecting layer 141 on the surface of the first pixel defining layer 121 needs to be removed by laser removal, reverse trapezoidal development stripping, line evaporation of an organic film layer of incompatible metal, and the like. Or, the first reflecting layer 141 on the surface of the first pixel defining layer 121 is made of a transparent material, and the cathode metal layer 146 of the luminescent layer 14 is made of an opaque material.

Specifically, each second pixel defining layer 124 is correspondingly provided with two photoelectric sensors 18, wherein one photoelectric sensor 18 corresponds to the first oblique surface 1434 of the second reflecting layer 143, and the other photoelectric sensor 18 corresponds to the second oblique surface 1436 of the second reflecting layer 143. In this way, the optical waveguide may be reflected by the second reflecting layer 143 attached to the surface of the second pixel defining layer 124 to the photoelectric sensor 18 while propagating in the first pixel defining layer 121.

Figure 6:
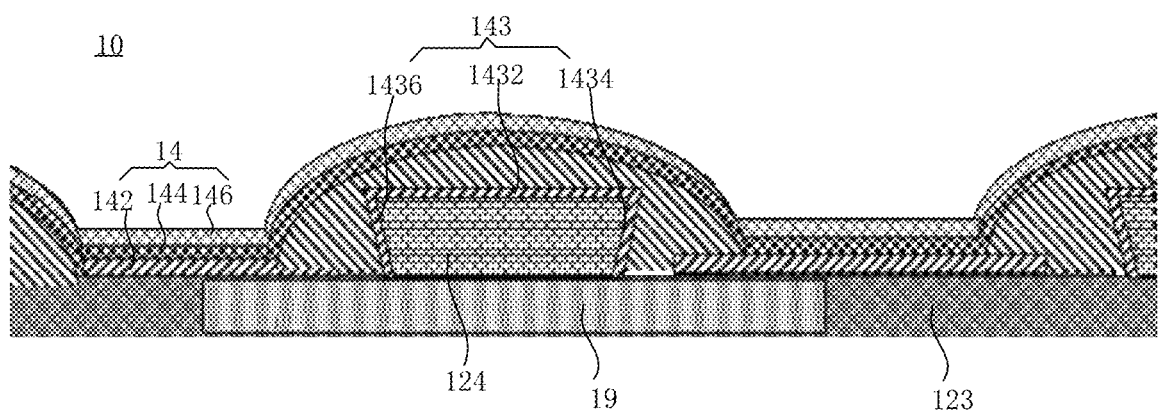

With reference to FIG. 6, in some embodiments, the display panel 10 further comprises an electrochromic layer 19, the electrochromic layer 19 is disposed in the array substrate 12, the electrochromic layer 19 is used for controlling the double-sided display of the display panel 10, and the electrochromic layer 19 is in a transparent state under an equipotential or powered-off condition, and is in a light-shielding state in the presence of a voltage difference.

The material of the electrochromic layer 19 may be any one of iridium oxide ($IrO_3$), chromium oxide ($Cr_2O_3$) or aluminum oxide ($Al_2O_3$). The electrochromic layer 19 may have a thickness of 1.5-2 microns. For example, the thickness of the electrochromic layer 19 may be 1.5 microns, 1.6 microns, 1.7 microns, 1.8 microns, 1.9 microns or 2.0 microns, etc.

Specifically, the electrochromic layer 19 may be disposed in the propagation path of the optical waveguide in the planarization layer 122, and may of course be disposed in other organic layers of the array substrate 12, such as the active layer, the interlayer dielectric layer (ILD), the grid layer (GE), and other organic layers. When the electrochromic layer 19 becomes transparent, the electrochromic layer 19 may transmit light, that is, the optical waveguide may pass through the electrochromic layer 19 and finally be transmitted to the outside of the display panel 10 through the array substrate 12, so that the display panel 10 may realize double-sided display. When the electrochromic layer 19 turns into a black state, the electrochromic layer 19 is opaque, that is, the optical waveguide cannot pass through the electrochromic layer 19, so that the optical waveguide of the display panel 10 may be transmitted to the outside of the display panel 10 through the optical film layers 16 only, making the display panel 10 realize one-sided display.

Of course, in other embodiments, the electrochromic layer 19 may also be disposed in the propagation path of the optical waveguide in the optical film layers 16, and specifically, the electrochromic layer 19 may be disposed in the propagation path of the optical waveguide in the thin film packaging layer 162, the light-transmitting module layer 164 or a polarizer (POL) in the optical film layers 16, so as to control the propagation of the optical waveguide.

Figure 7:
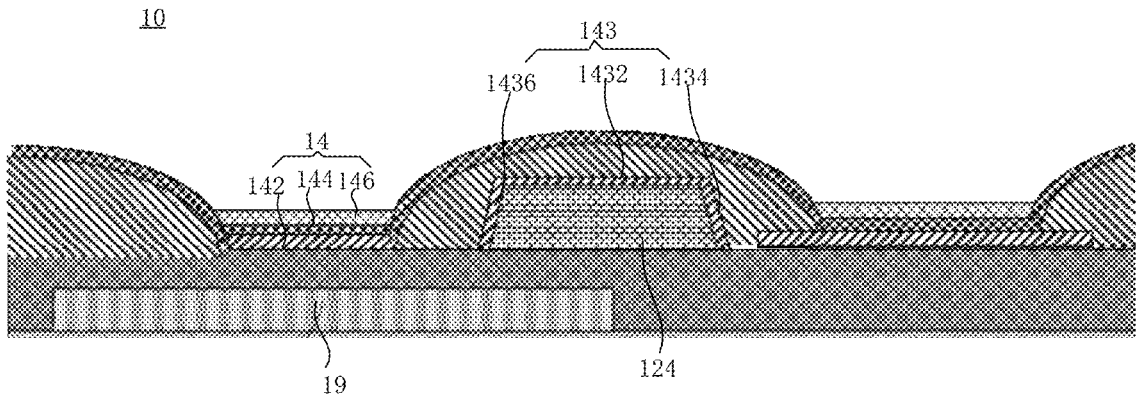

It should be noted that if the display panel 10 is of a top emission structure, the electrochromic layer 19 is disposed in a light-emitting side direction of the second pixel defining layer 124 (as shown in FIG. 6), and if the display panel 10 is of a bottom emission structure, the electrochromic layer 19 is located in a light-emitting side direction of the luminescent layer 14 (as shown in FIG. 7).

Figure 8:
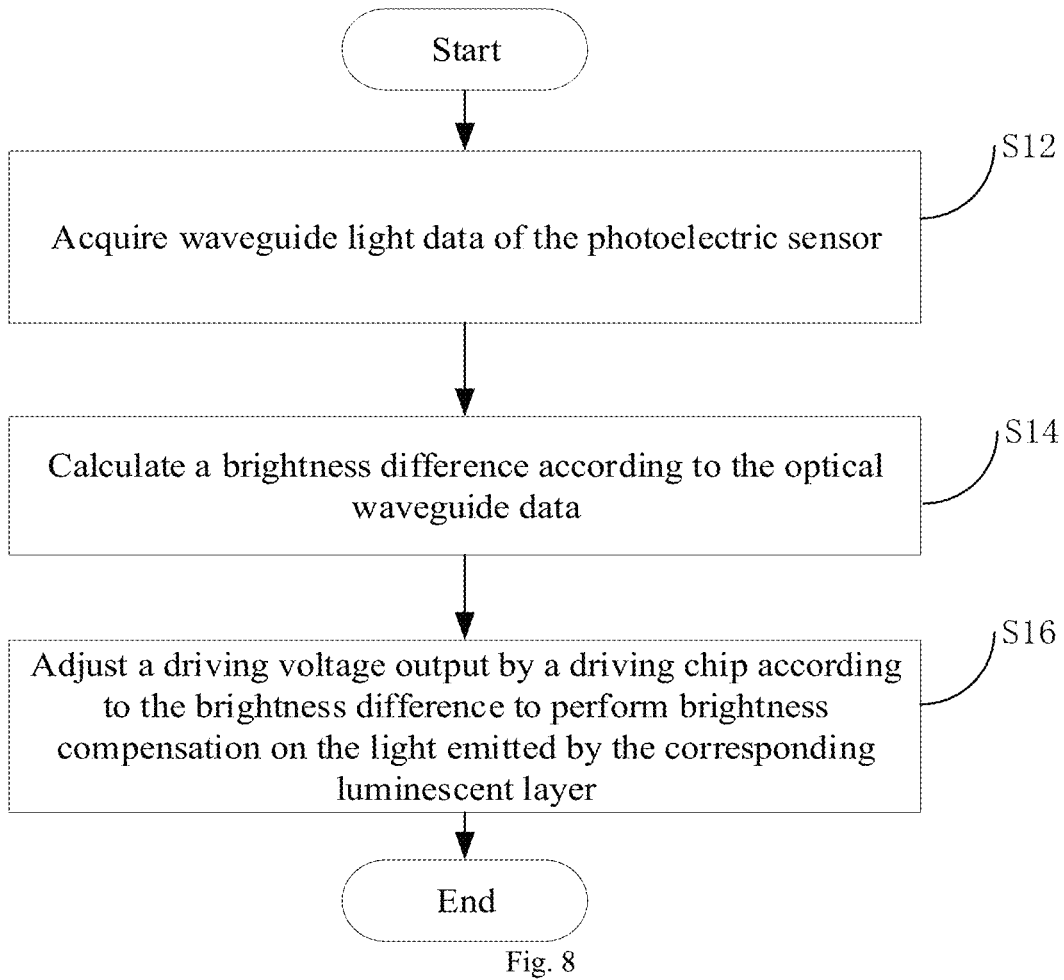
FIG. 8 is a flowchart of a brightness compensation method according to an embodiment of the disclosure.

Referring to FIG. 8, an embodiment of the disclosure further provides a brightness compensation method applied to any of the above display panels 10, and the compensation method comprises:

S12, acquiring optical waveguide data of the photoelectric sensor;

S14, calculating a brightness difference according to the optical waveguide data; and S16, adjusting a driving voltage output by a driving chip according to the brightness difference to perform brightness compensation on light emitted by the corresponding luminescent layer.

Figure 9:
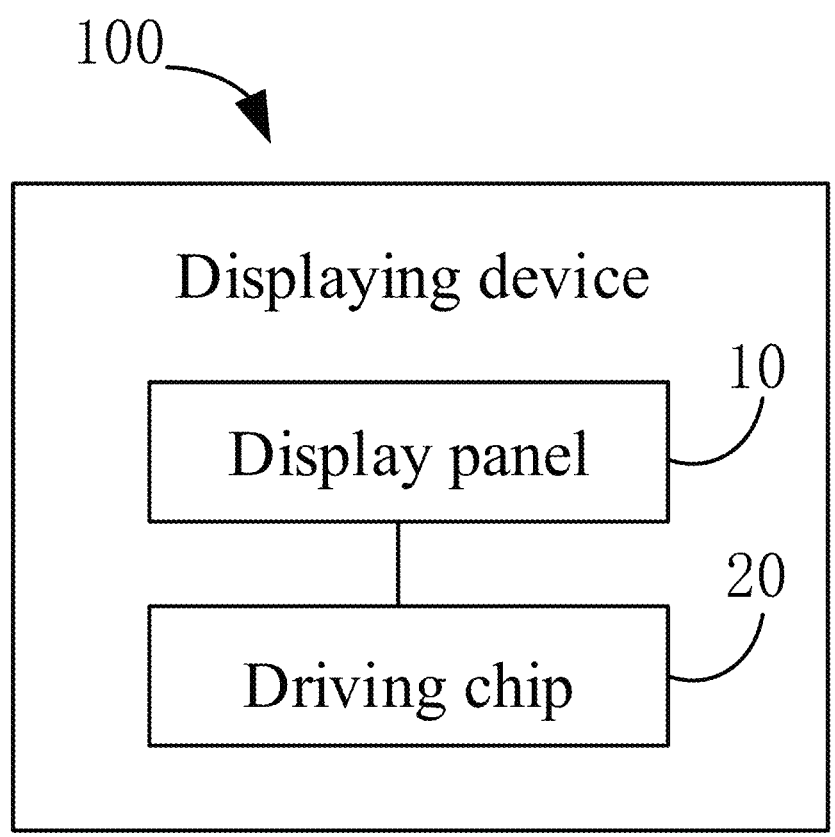
FIG. 9 is a modular diagram of a displaying device according to an embodiment of the disclosure.

Referring to FIG. 9, an embodiment of the disclosure also provides a displaying device 100, and the displaying device 100 comprises a driving chip 20 and any of the above display panels 10. The driving chip 20 is used to drive the display panel 10 to emit light.

In this specification, descriptions referring to the terms "one embodiment", "some embodiments", "exemplary embodiments", "example", "specific example", or "some examples" mean that specific features, materials or characteristics described in conjunction with this embodiment or example are included in at least one embodiment or example of this disclosure. In this specification, the schematic expressions of the above terms do not necessarily refer to the same embodiments or examples. Furthermore, the specific features, structures, materials or characteristics described may be combined in any one or more embodiments or examples in a suitable manner.

Although the embodiments of the disclosure have been shown and described, it will be understood by those of ordinary skill in the art that various changes, modifications, substitutions and variations may be made to these embodiments without departing from the principles and purposes of the disclosure, the scope of which is defined by the claims and their equivalents.

The invention claimed is:

1. A display panel, comprising:
an array substrate;
a luminescent layer located on one side of the array substrate, wherein the array substrate is configured for driving the luminescent layer to emit light;
a plurality of optical film layers located on a side, away from the array substrate, of the luminescent layer, wherein light emitted by the luminescent layer forms an optical waveguide on the array substrate and/or the optical film layers; and
a photoelectric sensor, configured for acquiring the optical waveguide to perform compensation of brightness on the light emitted by the luminescent layer according to data of the optical waveguide,
wherein the luminescent layer comprises a plurality of sub-luminescent layers, the plurality of sub-luminescent layers are disposed on a same layer at intervals, the array substrate comprises:
a first pixel defining layer located between two adjacent said sub-luminescent layers, the photoelectric sensor is disposed corresponding to the first pixel defining layer, the luminescent layer further comprises a first reflecting layer attached to a surface of the first pixel defining layer, and the optical waveguide passes through the first pixel defining layer and is reflected by the first reflecting layer to the photoelectric sensor.

2. The display panel according to claim 1, wherein the array substrate further comprises a second pixel defining layer, the second pixel defining layer is disposed in the first pixel defining layer, a second reflecting layer is attached to a surface of the second pixel defining layer, and the optical waveguide passes through the second pixel defining layer and is reflected by the second reflecting layer to the photoelectric sensor.

3. The display panel according to claim 2, wherein the second pixel defining layer is of an inverted trapezoid shape, and the second reflecting layer comprises a top surface and a first oblique surface; and the top surface is disposed on a side, away from the array substrate, of the second pixel defining layer, the first oblique surface is attached to an oblique edge of the second pixel defining layer and connected to the top surface, and the optical waveguide passes through the second pixel defining layer and is reflected by the top surface and the first oblique surface to the photoelectric sensor.

4. The display panel according to claim 2, wherein the second pixel defining layer is of an inverted trapezoid shape, and the second reflecting layer comprises a top surface, a first oblique surface and a second oblique surface; and the first top surface is disposed on a side, away from the array substrate, of the second pixel defining layer, the first oblique surface and the second oblique surface are symmetrically disposed on two sides of the top surface and are attached to the second pixel defining layer, and the optical waveguide passes through the second pixel defining layer to the second oblique surface and is reflected by the second oblique surface to the photoelectric sensor.

5. The display panel according to claim 2, wherein the second pixel defining layer is trapezoidal, and the second reflecting layer comprises a top surface and a first oblique surface; and the top surface is attached to a side, away from the array substrate, of the second pixel defining layer, the first oblique surface is attached to an oblique surface of the second pixel defining layer and connected to the top surface, and the optical waveguide passes through the second pixel defining layer and is reflected to the photoelectric sensor through the top surface.

6. The display panel according to claim 2, wherein the optical film layer comprises a thin film packaging layer and a light-transmitting module layer disposed in sequence, the light-transmitting module layer is disposed on a side, away from the luminescent layer, of the thin film packaging layer, and the photoelectric sensor is disposed in the light-transmitting module layer and located in a light-emitting side direction of the second pixel defining layer.

7. The display panel according to claim 6, wherein the second reflecting layer comprises a first oblique surface and a second oblique surface; and
each of the second pixel defining layer is correspondingly provided with two photoelectric sensors, one photoelectric sensor corresponds to the first oblique surface of the first reflecting layer, and the other photoelectric sensor corresponds to the second oblique surface of the second reflecting layer.

8. The display panel according to claim 4, further comprising an electrochromic layer, wherein the electrochromic layer is disposed in the array substrate and is configured for controlling double-sided display of the display panel, and the electrochromic layer is in a transparent state under an equipotential or powered-off condition, and the electrochromic layer is in a light-shielding state in the presence of a voltage difference.

9. The display panel according to claim 8, wherein the display panel is of a top emission structure, and the electrochromic layer is located in the light-emitting side of the second pixel defining layer.

10. The display panel according to claim 8, wherein the display panel is of a bottom emission structure, the luminescent layer comprises a cathode metal layer which is non-transparent, and the electrochromic layer is located in the light-emitting side of the luminescent layer.

11. The display panel according to claim 10, wherein the electrochromic layer is made of any one of iridium oxide, chromium oxide or aluminum oxide.

12. The display panel according to claim 11, wherein the thickness of the electrochromic layer is 1.5 microns to 2 microns.

13. The display panel according to claim 1, wherein the first pixel defining layer is made of a transparent organic material.

14. The display panel according to claim 1, wherein the display panel further comprises a planarization layer and a source-drain layer, the planarization layer is disposed on a side, away from the luminescent layer, of the first pixel defining layer, and the planarization layer is located on the same layer with the source-drain layer and the photoelectric sensor is disposed in the planarization layer.

15. A method for compensation of brightness, wherein the method is applied to the display panel according to claim 1, and the method comprises:
acquiring optical waveguide data of the photoelectric sensor;
calculating a brightness difference according to the optical waveguide data; and
adjusting a driving voltage output by a driving chip according to the brightness difference to perform compensation of brightness on light emitted by the corresponding luminescent layer.

16. A displaying device, comprising the display panel according to claim 1.

* * * * *